US008119504B2

(12) United States Patent
Tai et al.

(10) Patent No.: US 8,119,504 B2
(45) Date of Patent: Feb. 21, 2012

(54) METHOD FOR TRANSFERRING A NANO MATERIAL FROM A SUBSTRATE TO ANOTHER SUBSTRATE

(76) Inventors: Nyan-Hwa Tai, Hsinchu (TW);
Tsung-Yen Tsai, Hsinchu (TW)

( * ) Notice: Subject to any disclaimer, the term of this patent is extended or adjusted under 35 U.S.C. 154(b) by 0 days.

(21) Appl. No.: 12/782,610

(22) Filed: May 18, 2010

(65) Prior Publication Data

US 2011/0189799 A1 Aug. 4, 2011

(30) Foreign Application Priority Data

Jul. 6, 2009 (TW) ............................... 98122762 A (51) Int. Cl.
*H01L 21/20* (2006.01)
(52) U.S. Cl. ................. 438/478; 257/E51.04; 977/773; 977/842; 977/845
(58) Field of Classification Search ................. 438/458, 438/478; 257/E51.04; 977/773, 842, 845
See application file for complete search history.

(56) References Cited

U.S. PATENT DOCUMENTS

| 2006/0134883 | A1* | 6/2006 | Hantschel et al. | ............ 438/458 |
| 2008/0023693 | A1* | 1/2008 | Dubrow et al. | ................. 257/24 |
| 2010/0055824 | A1* | 3/2010 | Lin et al. | ......................... 438/73 |
| 2010/0075468 | A1* | 3/2010 | Dubrow et al. | ............... 438/149 |
| 2011/0126896 | A1* | 6/2011 | Wang et al. | .................... 136/256 |

* cited by examiner

*Primary Examiner* — Kevin Parendo
(74) *Attorney, Agent, or Firm* — Hamilton, DeSanctis & Cha LLP (57) ABSTRACT

A method for transferring a nano material formed on a first substrate through deposition techniques to a second substrate, includes: (A) contacting the second substrate with a free end of the nano material on the first substrate; (B) heating the first substrate so that heat is conducted substantially from the first substrate through the nano material to the second substrate to soften a contact portion of a surface of the second substrate that is in contact with the free end of the nano material; (C) after step (B), cooling the second substrate so as to permit hardening of the contact portion of the surface of the second substrate and solid bonding of the nano material to the second substrate; and (D) after step (C), removing the first substrate from the nano material.

7 Claims, 9 Drawing Sheets

METHOD FOR TRANSFERRING A NANO MATERIAL FROM A SUBSTRATE TO ANOTHER SUBSTRATE

CROSS-REFERENCE TO RELATED APPLICATION

This application claims priority of Taiwanese application No. 098122762, filed on Jul. 6, 2009.

BACKGROUND OF THE INVENTION

1. Field of the Invention

This invention relates to a method for transferring a nano material from a substrate to another substrate, more particularly to a method involving heating a first substrate on which a nano material is formed so that heat is conducted substantially from the first substrate through the nano material to a second substrate to which the nano material is to be transferred.

2. Description of the Related Art

As dimensions of electronic devices continue to scale down, nano materials, such as nanowires, nanorods or carbon nanotubes (CNTs), have been developed for application to nano-devices. In addition, nanowires, nanorods and carbon nanotubes (CNTs) exhibit excellent field emission (FE) property and thus are ideal materials for making devices, such as field emission displays (FEDs).

Since the carbon nanotubes (CNTs) are flexible and semiconductive, they can be used to manufacture flexible electronic devices, such as flexible field emission displays. Conventionally, manufacture of the flexible electronic devices involves transfer of the carbon nanotubes (CNTs) from a hard substrate (e.g., a Si substrate), that can endure a high temperature for deposition of the carbon nanotubes (CNTs) thereon, to a flexible substrate (e.g., a polycarbonate (PC) substrate).

Figure 1A:
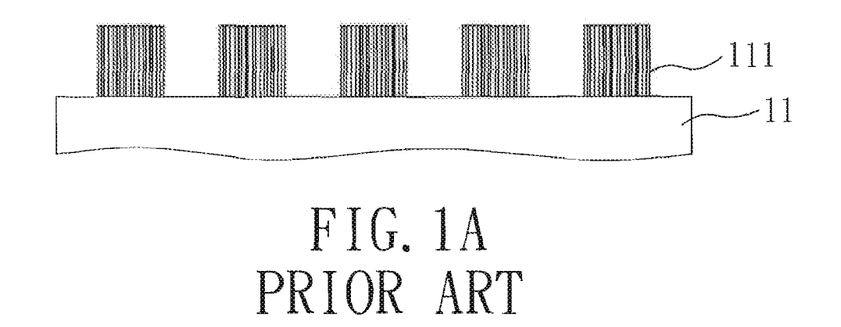
FIGS. 1A to 1C are schematic diagrams to illustrate consecutive steps of a conventional method for transferring a CNT array pattern from a Si substrate to a flexible substrate.
Figure 1B:
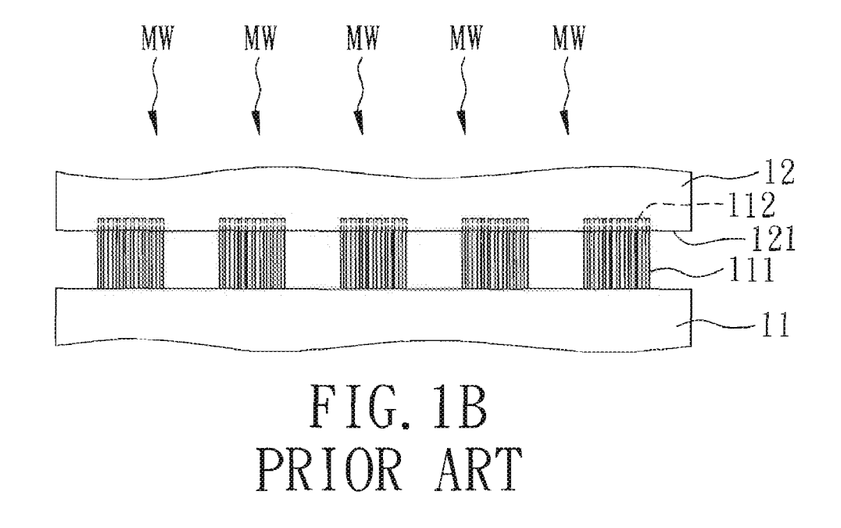
Figure 1C:
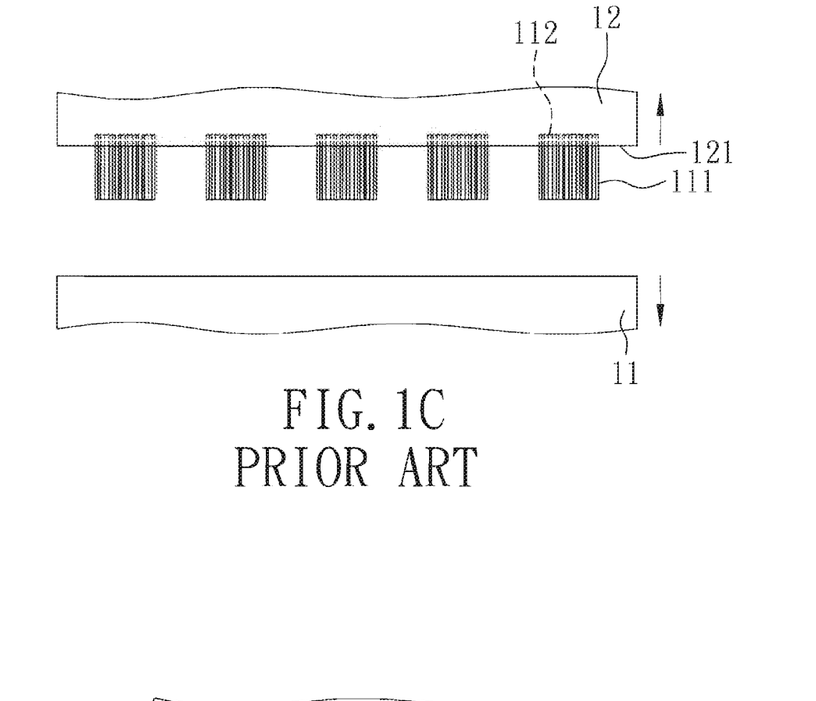
Figure 2:
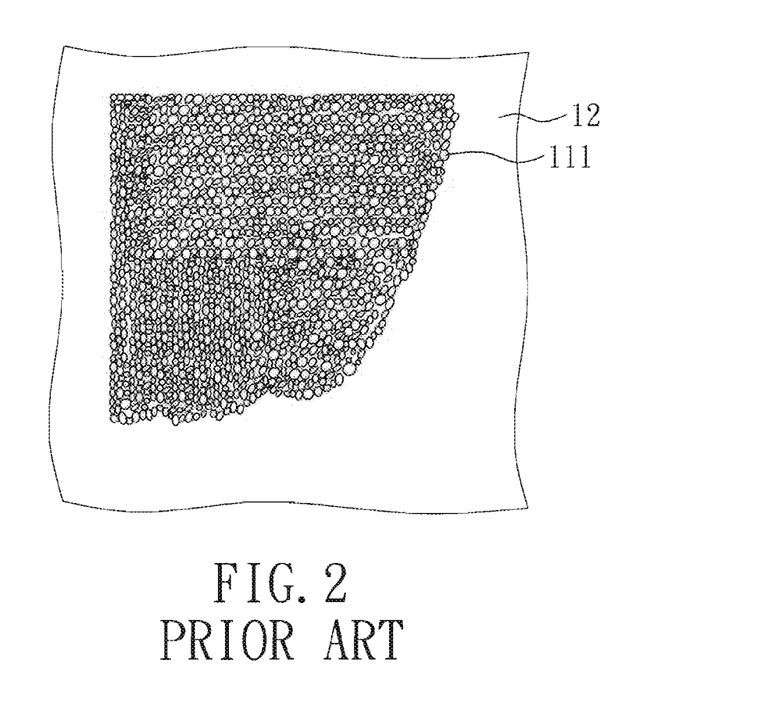
FIG. 2 is a fragmentary view to illustrate an experimental result of transferring the CNT array pattern from the Si substrate to the flexible substrate according to the conventional method.

FIGS. 1A to 1C illustrate consecutive steps of a conventional method for transferring a CNT array pattern 111 from a Si substrate 11 to a flexible substrate 12 so as to form a nano-material integrated substrate (see *Nanotechnology*, 19 (2008) 465303 (6 pp) disclosed by the inventor of the present invention). The conventional method includes the steps of: (a) forming the CNT array pattern 111 on the Si substrate 11 (see FIG. 1A); (b) placing the flexible substrate 12 made from polycarbonate on a top end 112 of the CNT array pattern 111 and then heating the assembly of the Si substrate 11, the flexible substrate 12 and the CNT array pattern 111 in a microwave reaction chamber (not shown), the heating being conducted under an output power of 400 W of the microwave (MW) reaction chamber for 30 seconds to 60 seconds so as to soften a surface 121 of the flexible substrate 12 and to allow the top end 112 of the CNT array pattern 111 to extend into the softened surface 121 of the flexible substrate 12 (see FIG. 1B); (c) cooling the assembly so as to permit hardening of the softened surface 121 of the flexible substrate 12 and solid bonding of the CNT array pattern 111 to the flexible substrate 12; and (d) removing the Si substrate 11 from the CNT array pattern 111 so as to form the nano-material integrated substrate (see FIG. 1C). Although the aforesaid method can be used to transfer the CNT array pattern 111, it tends to suffer from the problem of incomplete transfer, i.e., a portion of the CNT array pattern 111 remains on the Si substrate 11 after removal of the Si substrate 11 from the CNT array pattern 111. FIG. 2 shows an experimental result of transferring the CNT array pattern 111 from the Si substrate 11 to the flexible substrate 12 using the microwave reaction chamber as a heating means. The result shows that only a portion of the CNT array pattern 111 is successfully transferred from the Si substrate 11 to the flexible substrate 12 after removal of the Si substrate 11. As a consequence, the nano-material integrated substrate thus formed has detects and is not suitable for manufacturing the aforesaid electronic devices.

Therefore, there is a need in the art to provide a method that can substantially transfer the entire nano material from a first substrate to a second substrate.

SUMMARY OF THE INVENTION

Therefore, the object of the present invention is to provide a method for transferring a nano material from a first substrate to a second substrate that can overcome the aforesaid drawback of the prior art.

According to this invention, there is provided a method for transferring a nano material from a first substrate to a second substrate. The nano material is formed on the first substrate through deposition techniques. The method comprises: (A) contacting the second substrate with a free end of the nano material on the first substrate; (B) heating the first substrate so that heat is conducted substantially from the first substrate through the nano material to the second substrate to soften a contact portion of a surface of the second substrate that is in contact with the free end of the nano material; (C) after step (B), cooling the second substrate so as to permit hardening of the contact portion of the surface of the second substrate and solid bonding of the nano material to the second substrate; and (D) after step (C), removing the first substrate from the nano material.

BRIEF DESCRIPTION OF THE DRAWINGS

Other features and advantages of the present invention will become apparent in the following detailed description of the preferred embodiment of this invention, with reference to the accompanying drawings, in which.

DETAILED DESCRIPTION OF THE PREFERRED EMBODIMENT

Figure 3A:
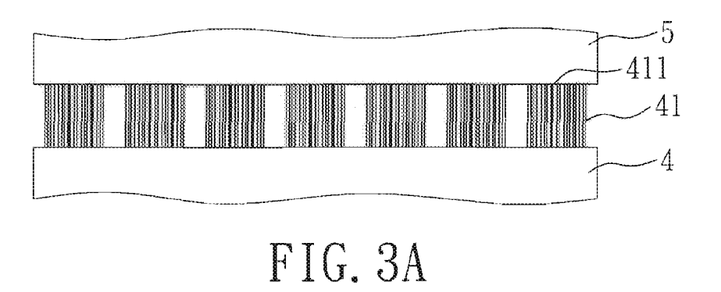
FIGS. 3A to 3C are schematic diagrams to illustrate consecutive steps of the preferred embodiment of a method for transferring a nano material from a first substrate to a second substrate according to this invention.
Figure 3B:
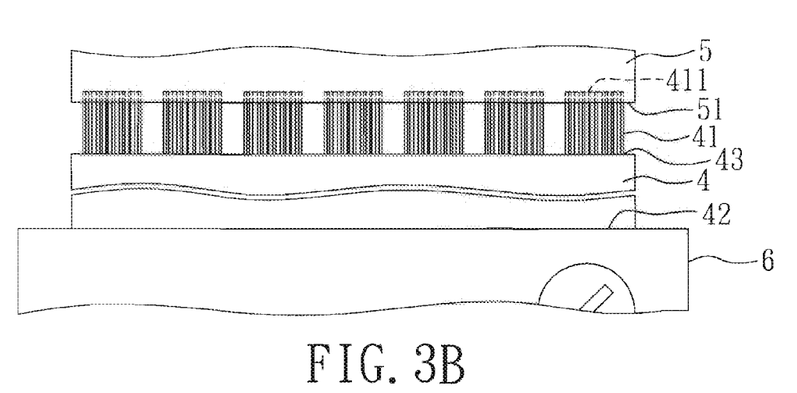
Figure 3C:
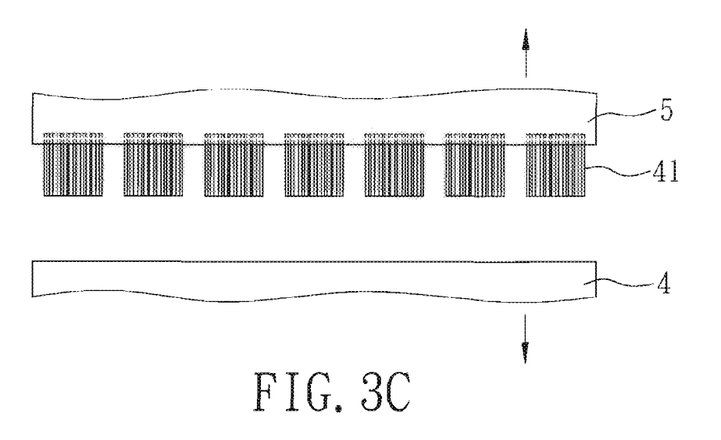

FIGS. 3A, 3B, and 3C illustrate consecutive steps of the preferred embodiment of a method for transferring a nano material 41 from a first substrate 4 to a second substrate 5 to form a nano-material integrated substrate that can serve as a cathode for an electronic device, such as a field emission display. The nano material 41 is formed on the first substrate 4 through deposition techniques. The method includes: contacting the second substrate 5 with a free end 411 of the nano material 41 on the first substrate 4 (see FIG. 3A); heating the first substrate 4 for a working time so that heat is conducted substantially from the first substrate 4 through the nano material 41 to the second substrate 5 to soften a contact portion of a surface 51 of the second substrate 5 that is in contact with the free end 411 of the nano material 41 (see FIG. 3B); after the heating operation, cooling the second substrate 5 so as to permit hardening of the contact portion of the surface 51 of the second substrate 5 and solid bonding of the nano material 4 to the second substrate 5; and after the cooling operation, removing the first substrate 4 from the nano material 41 (see FIG. 3C), thereby forming the nano-material integrated substrate.

Preferably, the first substrate 4 is heated by a heater 6 attached to a first surface 42 of the first substrate 4 opposite to a second surface 43 of the first substrate 4 on which the nano material 41 is formed. More preferably, the heater 6 is a plate-type neater, such as a hot plate. Preferably, the working time of the heating operation is less than 10 minutes.

Preferably, the first substrate 4 is a Si substrate with a thickness ranging from 250 μm to 750 μm and having a thermal conductivity of about 160 W/mK.

Preferably, the second substrate 5 is made from a thermoplastic material. The thermoplastic material a glass transition temperature $T_g$ and a melting temperature $T_m$. Preferably, the first surface 42 of the first substrate 4 is heated to a temperature $T_w$, where $T_g < T_w \leq [T_g + 30\% (T_m - T_g)]$. More preferably, the thermoplastic material is a polycarbonate (PC), the second substrate 5 has a thickness ranging from 350 μm to 750 μm, and the temperature $T_w$ is greater than 150° C. and is not greater than 185° C.

Preferably, the nano material 4 contains multi-walled carbon nanotubes (MWCNTs), each of which has a thermal conductivity of about 3000 W/mK.

The following example is provided to illustrate the merits of the preferred embodiment of the invention, and should not be construed as limiting the scope of the invention.

Example 1 (E1)

A nano-material integrated substrate was prepared according to the following processing steps. A Si substrate having a thickness of 500 μm was put into a sputtering system and was deposited with a layered structure of $(Co/Ti)_n$ having a predetermined pattern and including stacked Co layers and Ti layers, each of the Co layers and Ti layers having a layer thickness ranging from 0.5 nm to 3 nm. The layered structure thus formed was deposited with a MWCNT array pattern, having a height of 6 μm, thereon in a cold-wall thermal CVD system under a Volume flow rate of 60 sccm of $C_2H_2$, a working pressure of 10 Torr, and a working temperature of 550° C.

The MWCNT array pattern thus formed on the Si substrate was transferred to a PC substrate having a thickness of 500 μm, a glass transition temperature $T_g$ of 150° C. and a melting temperature $T_m$ of 267° C. The transfer was performed according to the following steps. First, the PC substrate was brought into contact with the MWCNT array pattern on the Si substrate. The Si substrate was then heated using a hot plate (Model No. NEWLAB HP-303D) attached to the Si substrate. The Si substrate was heated to a temperature $T_w$ of 170° C. and was maintained at this temperature for a working time of about 5 minutes so as to soften a surface of the PC substrate and to allow an end of the MWCNT array pattern to extend into the softened surface of the PC substrate. The softened PC substrate was then cooled. Finally, the Si substrate was removed from the assembly of the MWCNT array pattern and the PC substrate so as to form the nano-material integrated substrate.

Figure 4:
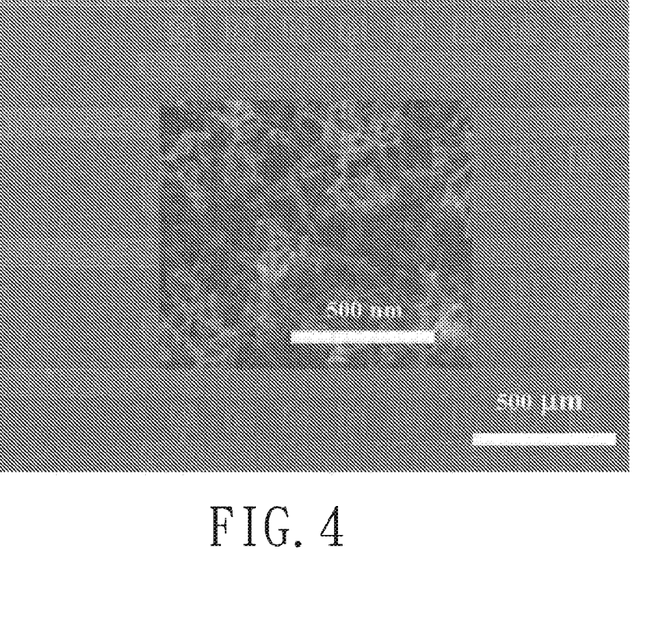
FIG. 4 is a scanning electron microscope (SEM) image, which has a higher magnification image inserted therein, to show the macro-structure of a transferred multi-walled carbon nanotube (MWCNT) array pattern of a nano-material integrated substrate of Example 1 (E1)
Figure 5:
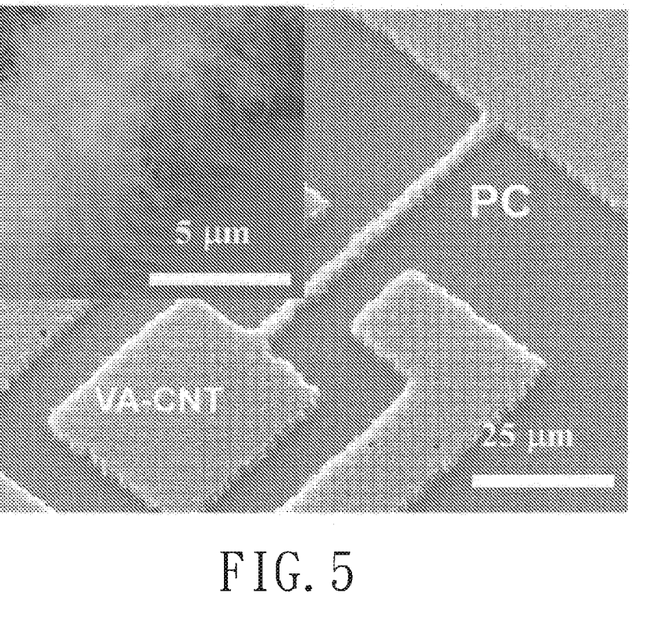
FIG. 5 is an enlarged SEM image of FIG. 4, which has a higher magnification image inserted therein, to show the structure of a vertical array-CNT (VA-CNT) unit of transferred MWCNT array pattern of the nano-material integrated substrate of Example 1 (E1)

FIG. 4 is a SEM image showing the macro-structure of the transferred MWCNT array pattern of the nano-material integrated substrate of Example 1 (E1), having a plurality of VA-CNT units. FIG. 5 is an enlarged SEM image of FIG. 4 to show the structure of one VA-CNT unit of the transferred MWCNT array pattern. The result shown in FIGS. 4 and 5 demonstrates that the MWCNT array pattern can be completely transferred from the Si substrate to the PC substrate using the method of this invention.

Figure 6:
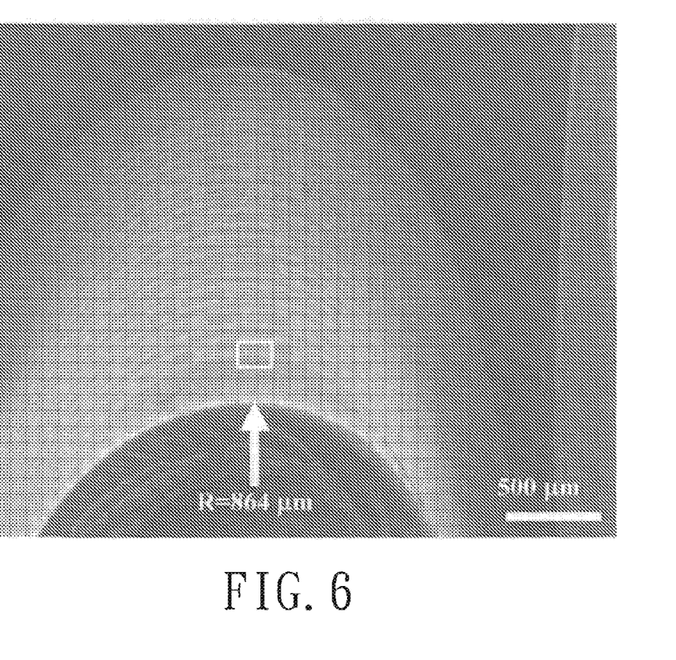
FIG. 6 is an inclined SEM image to show the structure of the nano-material integrated substrate of Example (E1) under a bending condition.
Figure 7:
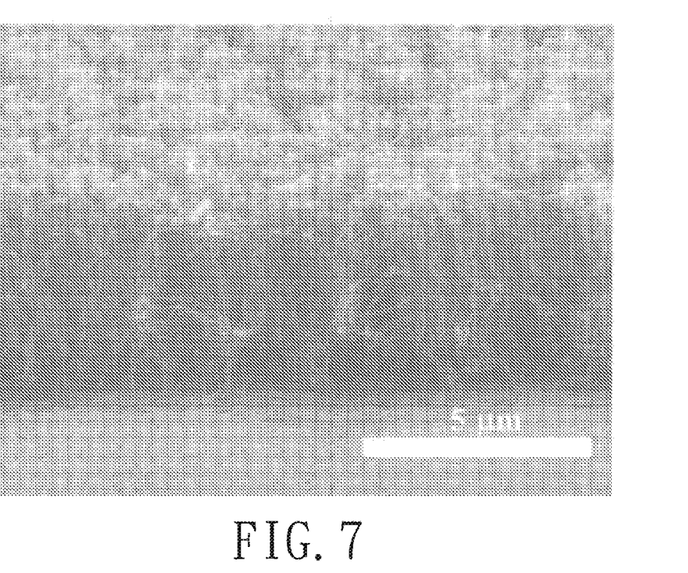
FIG. 7 is an enlarged SEM image of FIG. 6.

FIG. 6 is an inclined SEM image to show the macro-structure of the nano-material integrated substrate of Example 1 (E1) under a bending state. FIG. 7 is an enlarged SEM image of FIG. 6 to show the structure of one CNT unit of the transferred MWCNT array pattern on the PC substrate. The results shown in FIGS. 6 and 7 demonstrate that the bonding between the PC substrate and the transferred MWCNT array pattern remains strong and that no breakage of the transferred MWCNT array pattern or peeling of the transferred MWCNT array pattern is found when the nano-material integrated substrate of Example 1 is under the bending state.

Application of the Nano-Material Integrated Substrate of Example 1

Figure 8:
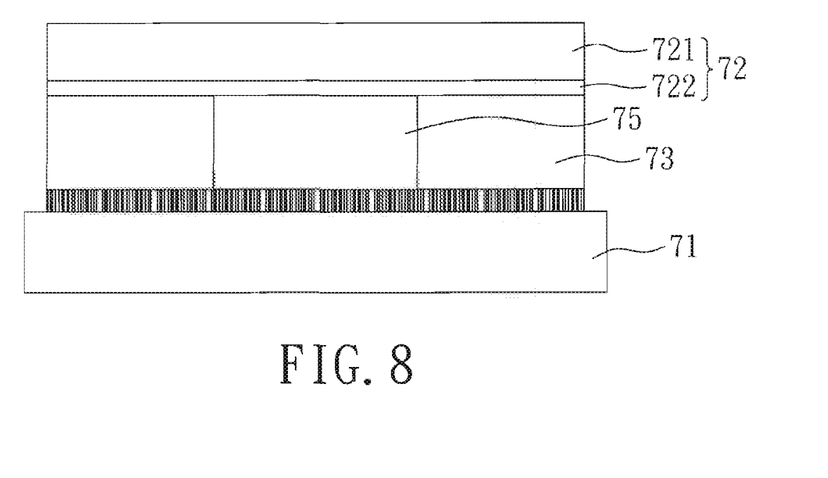
FIG. 8 is a schematic view to illustrate the structure of a non-flexible field emission display (non-FFED) that includes the nano-material integrated substrate of Example 1 (E1)

FIG. 8 illustrates a non-flexible field emission display (non-FEED) that includes a cathode 71 made from the nano-material integrated substrate of Example 1, an anode 72 opposite to the cathode 71, and a spacer unit 73 made from Teflon®, having a layer thickness of 300 μm, and disposed between the cathode 71 and the anode 72. The anode 72 has an indium tin oxide (ITO) glass substrate 721 coated with a phosphor layer 722 thereon. The cathode 71, the anode 72, and the spacer unit 73 cooperatively confine a vacuum space 75 thereamong. The pressure of the vacuum space 75 ranges from $10^{-6}$ Torr to $10^{-7}$ Torr.

Figure 9:
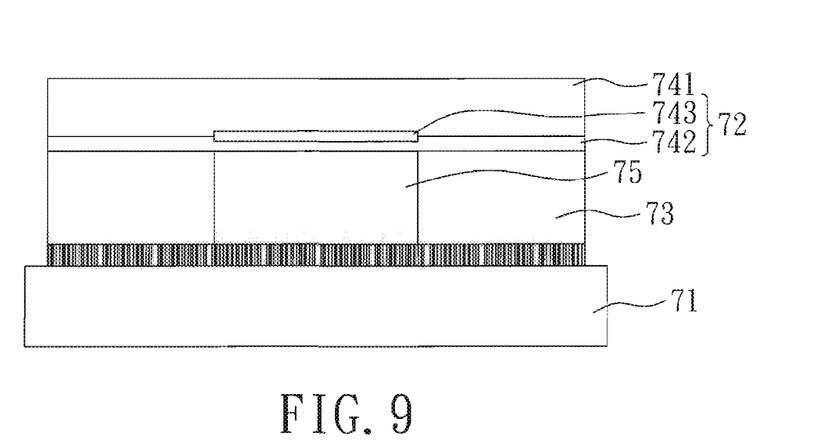
FIG. 9 is a schematic view to illustrate the structure of a flexible field emission display (FFED) that includes the nano-material integrated substrate of Example 1 (E1)

FIG. 9 illustrates a flexible field emission display (FFED) having a structure similar to that of FIG. 8, except that the anode 72 has a PC substrate 741, a Mo layer 742 having a thickness of 50 nm and serving as a electrical conductive layer, and a phosphor layer 743 formed between the PC substrate 741 and the Mo layer 742.

Figure 10:
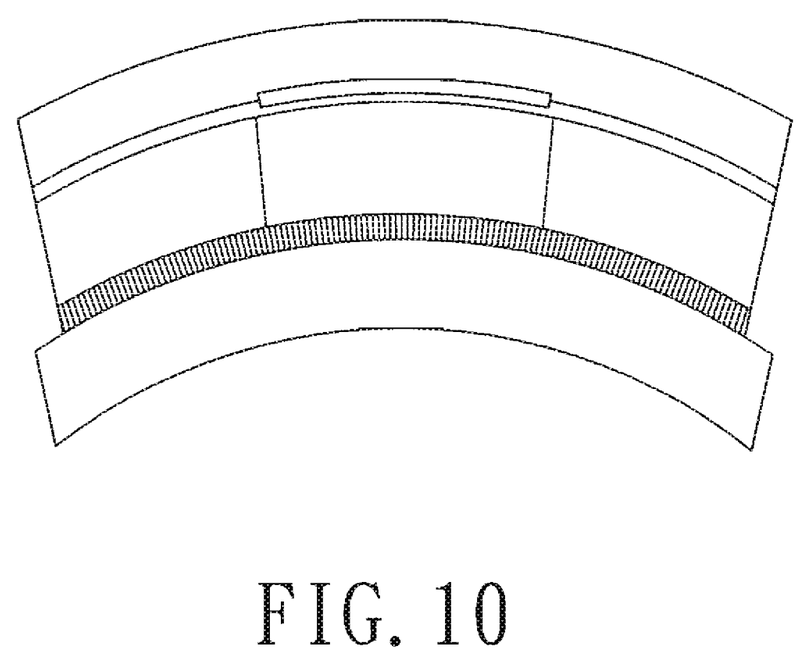
FIG. 10 is a schematic view to illustrate a state where the flexible field emission display (FFED) of FIG. 9 is bent.

FIG. 10 illustrates a state where the flexible field emission display (FFED) of FIG. 9 is bent such that the bent field emission display has a curvature of 4.5 cm.

Both the non-flexible field emission display (non-FFED) of FIG. 8 and the flexible field emission display (FFED) of FIG. 9 are suitable for application to a double-faced field emission display, which displays an image at two opposite surfaces thereof.

Figure 11:
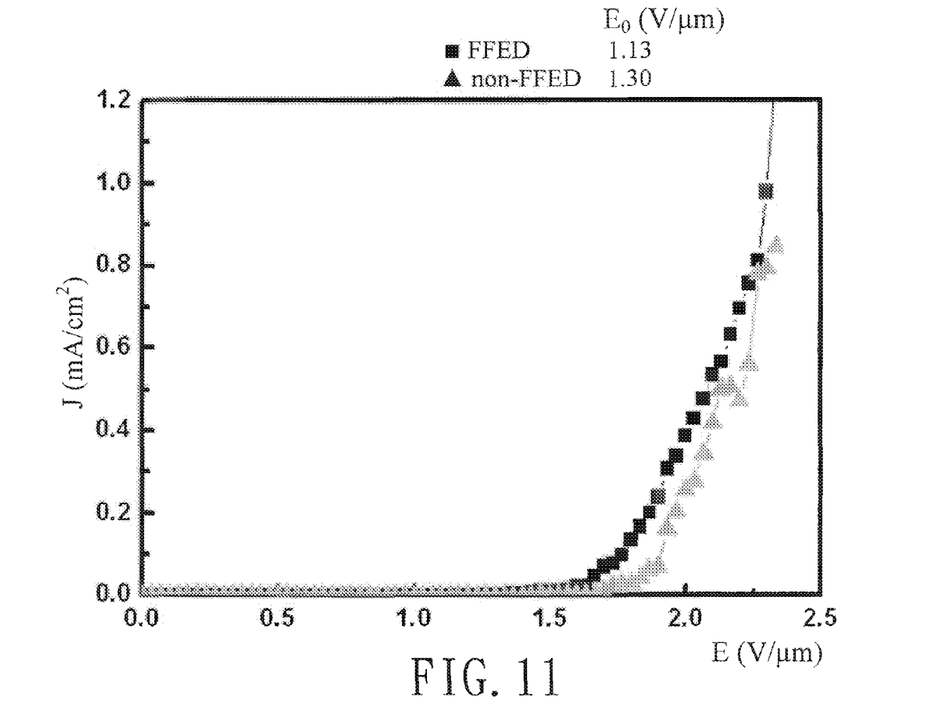
FIG. 11 is a plot of current density (J) vs. electric field (E) for the field emission displays of FIGS. 8 and 10.

FIG. 11 is a plot of current density (J) vs. electric field (E) for the non-flexible field emission display (non-FFED) of FIG. 8 and the bent field emission display (FFED) of FIG. 10. The higher the current density under the same electric field, the higher will be the brightness. The results show that the non-flexible field emission display (non-FFED) of FIG. 8 has a threshold field ($E_{th}$, an electric field under a current density of 1.0 mA/cm$^2$) of 2.25 V/μm and a turn-on field ($E_0$, an electric field under a current density of 10 μA) of 1.13 V/μm, while the bent field emission display (FFED) of FIG. 10 has a current density of 0.8 mA/cm$^2$ under an electric field of 2.25 V/μm and a turn-on field ($E_0$) of 1.30 V/μm. Hence, the brightness of the bent field emission display (FFED) of FIG. 10 and the brightness of the non-flexible field emission display (non-FFED) of FIG. 8 are close to each other under the electric field of 2.25 V/μm. The results indicate that the non-flexible field emission display (non-FFED) of FIG. 8 and the bent field emission display (FFED) of FIG. 10, each of which contains the cathode 71 made from the nano-material integrated substrate of the invention, have a brightness that can meet requirements in the industry.

Figure 12:
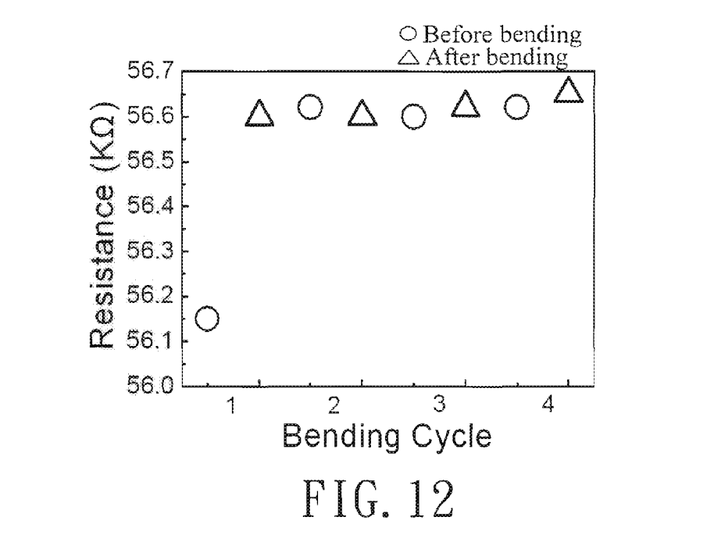
FIG. 12 is a plot of resistance (R) vs. bending cycles for the nano-material integrated substrate of Example 1 (E1)

FIG. 12 shows a plot of resistance (R) vs. bending cycle of the nano-material integrated substrate of Example 1. In each bending cycle, the nano-material integrated substrate was bent and was restored to its original planar configuration, and the resistance thereof was measured before the nano-material integrated substrate was bent and after the nano-material integrated substrate was restored to its original planar configuration. The results show that the resistance of the nano-material integrated substrate of Example 1 remains substantially the same for each bending cycle after the first bending cycle.

Figure 13A:
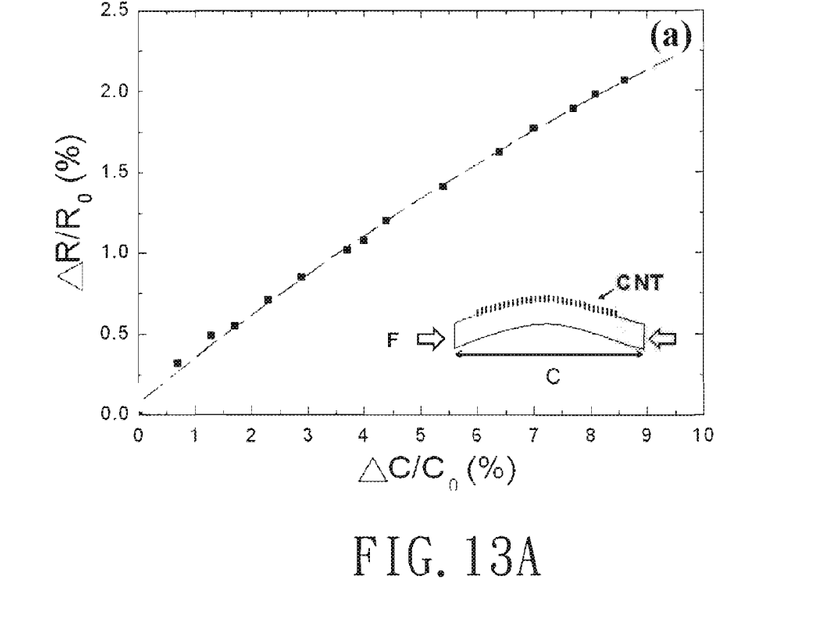
FIG. 13A is a plot of degree of resistance variation [($\Delta R/R_0$)×100%] vs. degree of deformation [($\Delta C/C_0$)×100%] for the nano-material integrated substrate of Example 1 under a tensile stress.
Figure 13B:
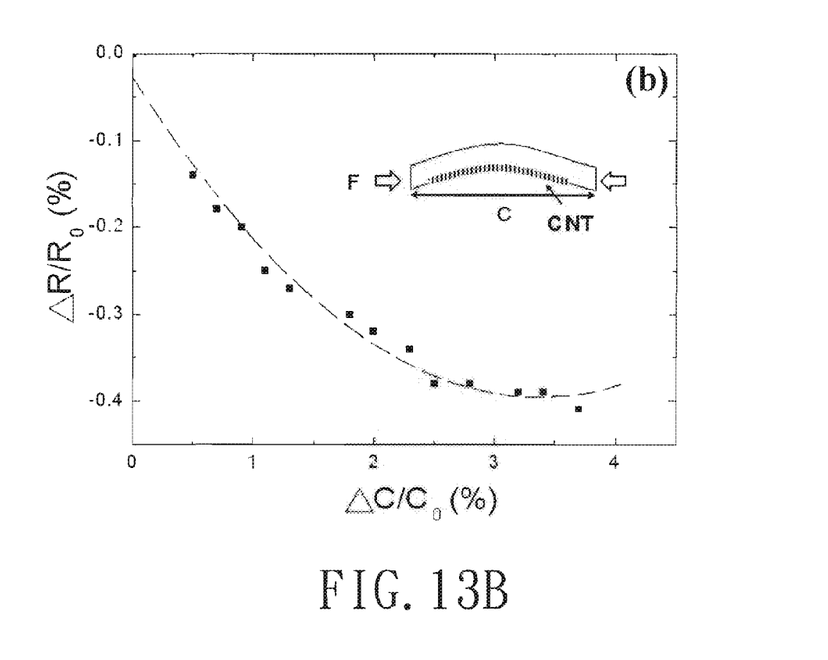
FIG. 13B is a plot of degree of resistance variation [($\Delta R/R_0$)×100%] vs. degree of deformation [($\Delta C/C_0$)×100%] for the nano-material integrated substrate of Example 1 under a compressive stress.

FIGS. 13A and 13B show the plots of degree of resistance variation [($\Delta R/R_0$)×100%] vs. degree of deformation [($\Delta C/C_0$)×100%] of the nano-material integrated substrate of Example 1, which is bent under a tensile stress and a compressive stress, respectively. The resistance variation ($\Delta R$) is defined as $R_i$-$R_0$, wherein $R_i$ and $R_0$ represent the resistance of the nano-material integrated substrate of Example 1 under bending and the resistance of the nano-material integrated substrate of Example 1 without bending, respectively. The deformation ($\Delta C$) is defined as $C_i$-$C_0$, wherein $C_i$ and $C_0$ represent the dimension of the nano-material integrated substrate of Example 1 along a length direction of the nano-material integrated substrate under bending and the dimension of the nano-material integrated substrate of Example 1 along the length direction without bending, respectively. The results show that the degree of the resistance variation [($\Delta R/R_0$)×100%] of the nano-material integrated substrate of Example 1 is gradually increased with an increase in the degree of deformation [($\Delta C/C_0$)×100%] thereof when the nano-material integrated substrate of Example 1 is under the tensile stress (see FIG. 13A), and that the degree of the resistance variation [($\Delta R/R_0$)×100%] of the nano-material integrated substrate of Example 1 is gradually decreased with an increase in the degree of deformation [($\Delta C/C_0$)×100%] thereof when the nano-material integrated substrate of Example 1 is under the compressive stress (see FIG. 13B).

Since the resistance of the nano-material integrated substrate varies with the stress applied thereto, the nano-material integrated substrate can also be an ideal material for making an electrical-resistance strain gage for measuring the strain of an object attached to the nano-material integrated substrate.

In conclusion, by allowing heat to be conducted from the first substrate through the nano material to the second substrate to soften the contact portion of the surface of second substrate, the nano material can be substantially transferred from the first substrate to the second substrate, thereby eliminating the aforesaid problem of incomplete transfer associated with the prior art.

While the present invention has been described in connection with what is considered the most practical and preferred embodiment, it is understood that this invention is not limited to the disclosed embodiment but is intended to cover various arrangements included within the spirit and scope of the broadest interpretation and equivalent arrangements.

What is claimed is:

1. A method for transferring a nano material from a first substrate to a second substrate, the nano material being formed on the first substrate through deposition techniques, the method comprising:
   (A) contacting the second substrate with a free end of the nano material on the first substrate;
   (B) heating the first substrate so that heat is conducted substantially from the first substrate through the nano material to the second substrate to soften a contact portion of a surface of the second substrate that is in contact with the free end of the nano material;
   (C) after step (B), cooling the second substrate, and thus hardening the contact portion of the surface of the second substrate and thus solid bonding substrate and solid bonding of the nano material to the second substrate; and
   (D) after step (C), removing the first substrate from the nano material.

2. The method of claim 1, wherein the first substrate is heated by a heater attached to a first surface of the first substrate that is opposite to a second surface of the first substrate on which the nano material is formed.

3. The method of claim 2, wherein the heater is a plate-type heater.

4. The method of claim 2, wherein the second substrate is made from a thermoplastic material.

5. The method of claim 4, wherein the thermoplastic material has a glass transition temperature $T_g$ and a melting temperature $T_m$ and wherein, the first surface of the first substrate is heated to a temperature $T_w$, where $T_g<T_w\leq[T_g+0.3(T_m-T_g)]$.

6. The method of claim 5, wherein the thermoplastic material is a polycarbonate, the second substrate has a thickness ranging from 350 μm to 750 μm, and the temperature $T_w$ is greater than 150° C. and is not greater than 185° C.

7. The method of claim 6, wherein the nano material comprises carbon nanotubes and the first substrate is a Si substrate with a thickness in the range of 250 μm to 750 μm.

* * * * *